US006933797B2

(12) United States Patent
Miyahara et al.

(10) Patent No.: US 6,933,797 B2
(45) Date of Patent: Aug. 23, 2005

(54) OSCILLATION CIRCUIT, ELECTRONIC APPARATUS, AND TIMEPIECE USING A POTENTIAL STABILIZATION CIRCUIT WITH RESISTIVE TERMINATIONS

(75) Inventors: Fumiaki Miyahara, Shiojiri (JP); Kunio Koike, Matsumoto (JP); Takashi Kawaguchi, Shiojiri (JP); Shinji Nakamiya, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 22 days.

(21) Appl. No.: 10/614,975

(22) Filed: Jul. 9, 2003

(65) Prior Publication Data

US 2004/0075508 A1 Apr. 22, 2004

(30) Foreign Application Priority Data

Jul. 10, 2002 (JP) ........................................ 2002-201195
May 20, 2003 (JP) ........................................ 2003-142196

(51) Int. Cl.[7] .................................................. H03B 5/36
(52) U.S. Cl. ....................................... 331/186; 331/158
(58) Field of Search ................................ 331/186, 158, 331/68, 62, 116 R, 116 FE

(56) References Cited

U.S. PATENT DOCUMENTS 4,861,168 A * 8/1989 Ziegler et al. .............. 374/117
5,617,062 A * 4/1997 O'Shaughnessy et al. .. 331/111
5,929,715 A 7/1999 Nakamiya et al. ............ 331/62
6,046,648 A 4/2000 Nakamiya et al. ..... 331/116 FE
6,507,248 B2 1/2003 Nakamura .................. 331/158
6,683,507 B2 * 1/2004 Jeong ..................... 331/117 R

FOREIGN PATENT DOCUMENTS

| | | |
|---|---|---|
| CN | 1189010 A | 7/1998 |
| CN | 1197326 A | 10/1998 |
| EP | 0 851 323 A1 | 7/1998 |
| GB | 2362276 A | 11/2001 |
| JP | A 56-132588 | 10/1981 |
| JP | A 58-15305 | 1/1983 |
| JP | A 5-41498 | 2/1993 |
| JP | A 2001-257535 | 9/2001 |
| JP | A 2002-57526 | 2/2002 |

* cited by examiner

*Primary Examiner*—Joseph Chang
(74) *Attorney, Agent, or Firm*—Oliff & Berridge, PLC

(57) ABSTRACT

This oscillation circuit includes a crystal oscillator and a main circuit portion connected by a signal path to the crystal oscillator and driven by the crystal oscillator. The main circuit portion is provided with a DC-cutting capacitor that galvanically separates the signal path between the input side of an inverter that is connected by the signal path to the crystal oscillator and an input terminal Xin of the signal path. A potential stabilization circuit is also provided, connecting the input terminal Xin of the signal path to the output side of the inverter through a resistance element.

15 Claims, 8 Drawing Sheets

OSCILLATION CIRCUIT, ELECTRONIC APPARATUS, AND TIMEPIECE USING A POTENTIAL STABILIZATION CIRCUIT WITH RESISTIVE TERMINATIONS

Japanese Patent Application No. 2002-201195, filed on Jul. 10, 2002, and Japanese Patent Application No. 2003-142196, filed on May 20, 2003, are hereby incorporated by reference in their entirety.

BACKGROUND OF THE INVENTION

The present invention relates to an oscillation circuit, an electronic apparatus, and a timepiece.

The oscillation circuit used in a portable wristwatch or electronic apparatus often uses a battery or a rechargeable secondary battery as a main power source to drive electronic circuitry. The electronic circuitry that is used in such an appliance often creates a reference clock from the oscillation frequency fs of the oscillation circuit.

An example of a conventional oscillation circuit is shown in FIG. 1.

In this figure, a main circuit portion 20 of an oscillation circuit is formed on a semiconductor substrate, and this main circuit portion 20 is connected to the two ends of a crystal oscillator 10 by input-output terminals Xin and Xout that are provided for a signal circuit.

The main circuit portion 20 comprises an inverter 22 connected by a signal path to the crystal oscillator 10 and a feedback resistor 24 connected to the input and output sides of the inverter 22.

Since the input terminal Xin of the crystal oscillator 10 is connected directly to the input side of the inverter 22 in this conventional oscillation circuit, if there is any change in the potential of the input terminal Xin of the crystal oscillator 10, a waveform in which the potential has changed is input directly to the inverter 22. If this input waveform does not cross the threshold voltage of the inverter 22 during this time, the operation of the oscillation circuit will halt.

If a fault such as a leak should occur between the input terminal Xin of the crystal oscillator 10 and the power source in this conventional oscillation circuit, changing the potential on the input side of the inverter 22, therefore, problems could occur such as a halting of the oscillation or large variations in the oscillation frequency if the oscillation does not actually stop.

In particular, since this main circuit portion 20 of the oscillation circuit is formed on the semiconductor substrate and the crystal oscillator 10 is attached externally, leakage can easily occur at the input terminal Xin that is the connection therebetween, making countermeasures necessary.

An example of a conventional oscillation circuit that uses a DC-cutting capacitor 26 as means for preventing the stopping of oscillation due to leakage is shown in FIG. 2.

In this conventional example, the DC-cutting capacitor 26 is connected between the input terminal X and the input side of the inverter 22 in the signal path.

The input terminal Xin of the crystal oscillator 10 and the input side of the inverter 22 are galvanically separated by this DC-cutting capacitor 26. In addition, the waveform that is input to the inverter 22 is a waveform that has been charged and discharged by the DC-cutting capacitor 26. For that reason, since the waveform that has been charged and discharged in the DC-cutting capacitor 26 crosses the threshold voltage of the inverter 22, the oscillation of the oscillation circuit does not halt, even if the potential of the input terminal Xin should change due to a leak or the like. In other words, it is possible to implement an oscillation circuit that operates stably with no problems such as oscillation halt, even if a leak should occur between the input terminal Xin of the crystal oscillator 10 and the power source.

However, if the DC-cutting capacitor 26 is provided on the input terminal Xin side of the signal path as shown in FIG. 2, the potential of the input terminal Xin of the crystal oscillator 10 will be close to the open state, which is extremely unstable. Moreover, any change in the potential of the input terminal Xin of the crystal oscillator 10 will cause a change in each depletion layer of the parasitic capacitances Cy1, Cy2, and Cx of the main circuit portion 20, changing the capacitances thereof.

Therefore, if a slight leak occurs at the input terminal Xin of the crystal oscillator 10 due to an external disturbance such as an increase of humidity or light, changing the potential of the input terminal Xin, the parasitic capacitances will change accordingly. As a result, the oscillation constant of the oscillation circuit will change, the oscillation frequency itself will change, and a problem will occur in that the operation of the electronic circuitry that uses that oscillation frequency as a reference clock will be adversely affected.

In particular, if the DC-cutting capacitor 26 of the conventional oscillation circuit is provided on the semiconductor substrate, a circuit configuration is created in which the parasitic capacitance Cx that is generated thereby is positioned on the input terminal Xin side, so that the previously-described generation of the minute leakage current causes variations in the magnitude of the parasitic capacitance Cx, which leads to large variations in the parasitic capacitance of the entire circuit, which causes a problem in that it results in large variations in the oscillation frequency.

BRIEF SUMMARY OF THE INVENTION

The present invention was devised in the light of the above-described technical problems. The present invention may implement an oscillation circuit, electronic apparatus, and timepiece that can oscillate stably, with little variation in the oscillation frequency.

(1) To achieve the above objective, according to one aspect of the present invention, there is provided an oscillation circuit having an oscillation source and a main circuit portion connected by a signal path to the oscillation source and driven by the oscillation source, the main circuit portion comprising:

an inverter connected to the oscillation source by the signal path;

a feedback resistor connected between the output side and the input side of the inverter;

an element that galvanically separates the signal path between an input terminal of the signal path and the input side of the inverter; and a potential stabilization circuit that connects the input terminal side of the signal path to a circuit portion with a stabilized potential through an element that functions as a resistor.

In accordance with this aspect of the present invention, a circuit portion with a stabilized potential is connected to an input terminal side of the signal path, through an element that functions as a resistor. Since there is no danger of the potential at the input terminal side falling into an unstable state, this makes it possible to implement an oscillation circuit that can continue to provide stable oscillation with little variation in the oscillation frequency, even if the circuitry is provided with an element that galvanically separates the signal path between the input terminal of the signal path and the input side of the inverter.

In this case, a DC-cutting capacitor or the like could be used as the element that galvanically separates the signal path, by way of example. In addition, a semiconductor element or the like that functions as a resistance element or resistor could be used selectively as the element that functions as a resistor, as necessary.

(2) The circuit portion with a stabilized potential may be one of a constant voltage side, a reference potential side, the input side of the inverter, the output side of the inverter, and the output side of the oscillation source.

If the oscillation circuit in accordance with the present invention and other circuit is provided within a semiconductor device, a circuit portion with a stabilized potential of the other circuit could be used instead of the circuit portion with a stabilized potential of the oscillation circuit. For example, a voltage output line of a constant voltage power source that supplies a constant voltage to the other circuitry could be used as the circuit portion with a stabilized potential, and connected to the input terminal of the signal path through an element that functions as a resistor.

(3) The potential stabilization circuit may connect the input terminal side of the signal path to an output terminal side of the signal path through the element that functions as a resistor.

In that case, the element that functions as a resistor may be set to have a resistance together with the feedback resistor within the range of 10 to 100 MΩ.

In other words, the resistance of the feedback resistor that is usually used in the oscillation circuit is 10 to 100 MΩ. It is therefore possible to implement stable oscillation similar to that of the previously verified oscillation circuits of the conventional art, by setting the combined resistance of the element that functions as a resistor of the potential stabilization circuit and the feedback resistor to the resistance value of the usual feedback resistor.

(4) The potential stabilization circuit may apply a bias voltage to the input terminal side of the signal path, through the element that functions as a resistor.

It is possible to stabilize the potential of the input terminal side and implement an oscillation circuit that can oscillate stably at a stable oscillation frequency, by employing a configuration in which a bias voltage is applied to the input terminal side of the signal path.

The configuration for applying the bias voltage in this case could be one in which the input terminal side of the signal path is connected to a predetermined constant voltage through an element that functions as a resistor and also the input terminal side of the signal path is connected to a predetermined reference potential side through an element that functions as a resistor.

(5) In addition, the potential stabilization circuit may be configured in such a manner that one end of the feedback resistor, which is connected by the other end to the output side of the inverter, is connected to the input terminal side of the signal path, instead of to the input side of the inverter.

In such a case, a bias voltage may be applied to the input side of the inverter through the element that functions as a resistor.

(6) In addition, the potential stabilization circuit may be formed by connecting the element that functions as a resistor, parallel to the element that galvanically separates the signal path.

In such a case, the element that functions as a resistor may be set to have a resistance value that is larger than a resistance value of the feedback resistor.

(7) Furthermore, the main circuit portion may be formed as a semiconductor device, and the oscillation source may be an oscillator with one end being connected to the input terminal of the signal path and the other end being connected to an output terminal of the signal path.

(8) With this configuration, the element that functions as a resistor may be formed by using polysilicon.

In other words, there would be no fundamental problem if the element that functions as a resistor were formed of a metal or the like, but there would be a problem from consideration of restrictions of disposition on a semiconductor substrate and restrictions of area or the like with a metal that has a low resistance per unit area. In contrast thereto, forming the element that functions as a resistor from polysilicon that has a high resistance per unit area would make it possible to make that element smaller, increasing the degree of freedom of the circuit disposition of the entire oscillation circuit, and thus enabling the implementation of a smaller size. In addition, since polysilicon is a material that has little leakage due to external disturbance by light, the use of such a material in the formation of the element that functions as a resistor makes it possible to further reduce the effects of leakage due to external disturbances such as light.

(9) With this configuration, the element that galvanically separates the signal path may be a DC-cutting capacitor that is formed by overlaying a dielectric layer that overlays a semiconductor substrate with an electrode layer, a dielectric layer, and another electrode layer.

Since the above-described configuration makes it possible to form a DC-cutting capacitor without using a diffusion region on the semiconductor substrate, it ensures that the parasitic capacitance is extremely small and thus that variations in the parasitic capacitance are also extremely small.

(10) With this configuration, the element that galvanically separates the signal path may be a DC-cutting capacitor formed by overlaying a diffusion region on a semiconductor substrate with a dielectric layer and an electrode layer, and the diffusion region may be connected to the input side of the inverter, and the electrode layer is connected to the input terminal side of the signal path.

By employing a configuration in which the electrode layer that configures the DC-cutting capacitor is connected to the input terminal side of the signal path and the diffusion region is connected to the input side of the inverter, the parasitic capacitance of the DC-cutting capacitor can be positioned on the input side of the inverter. It is therefore possible to have a circuit configuration in which variations in the parasitic capacitance of the DC-cutting capacitor do not affect the oscillation frequency of the oscillation circuit, even if the input side potential of the signal path should vary for some reason, leading to variations in the parasitic capacitance of the DC-cutting capacitor.

(11) With this configuration, an electrostatic protection circuit may be provided on the input terminal side of the signal path, and the electrostatic protection circuit may comprise:

a first protection circuit connected between the signal path and a predetermined constant voltage side, for causing any electrostatic voltage of a first polarity that intrudes into the signal path to be bypassed selectively to the constant voltage side through a plurality of first semiconductor rectifier elements connected in series; and a second protection circuit connected between the signal path and a reference potential side, for causing any electrostatic voltage of a second polarity that intrudes into the signal path to be bypassed selectively to the reference potential side through a plurality of second semiconductor rectifier elements connected in series.

In this case, the first and second semiconductor rectifier elements could be diodes or bipolar transistors or the like, as necessary.

The present invention makes it possible to substantially reduce the parasitic capacitance of the electrostatic protection circuit, by connecting a plurality of semiconductor rectifier elements in series, which makes it possible to implement an oscillation circuit that can oscillate at an even more stable frequency.

(12) An electronic apparatus in accordance with another aspect of the present invention comprises any one of the above oscillation circuits and a functional portion that is controlled on the basis of an output of the oscillation circuit.

Similarly, a timepiece in accordance with a further aspect of the present invention comprises any one of the above oscillation circuits and a time display portion that displays display based on an output of the oscillation circuit.

DETAILED DESCRIPTION OF THE EMBODIMENT

Figure 1:
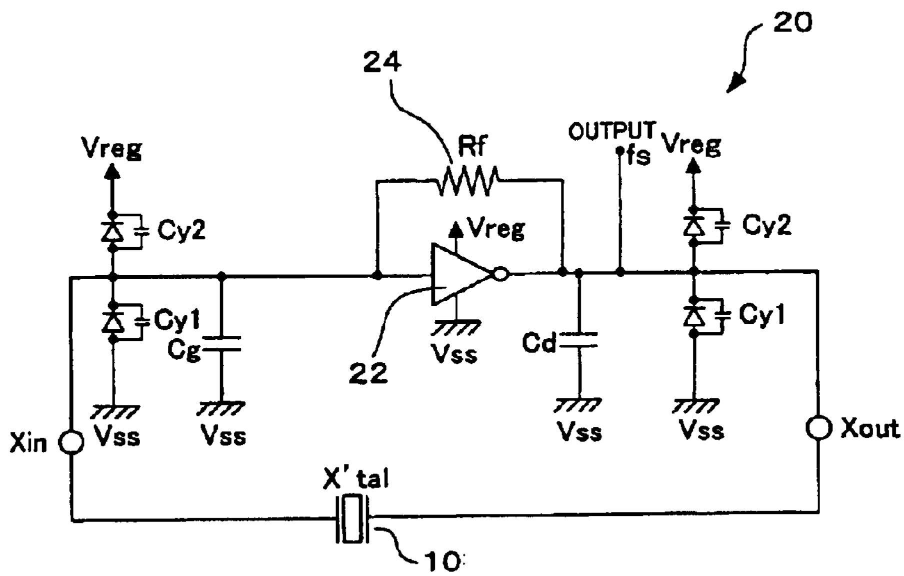
FIG. 1 is an illustrative view of a conventional oscillation circuit that does not use a DC-cutting capacitor.
Figure 2:
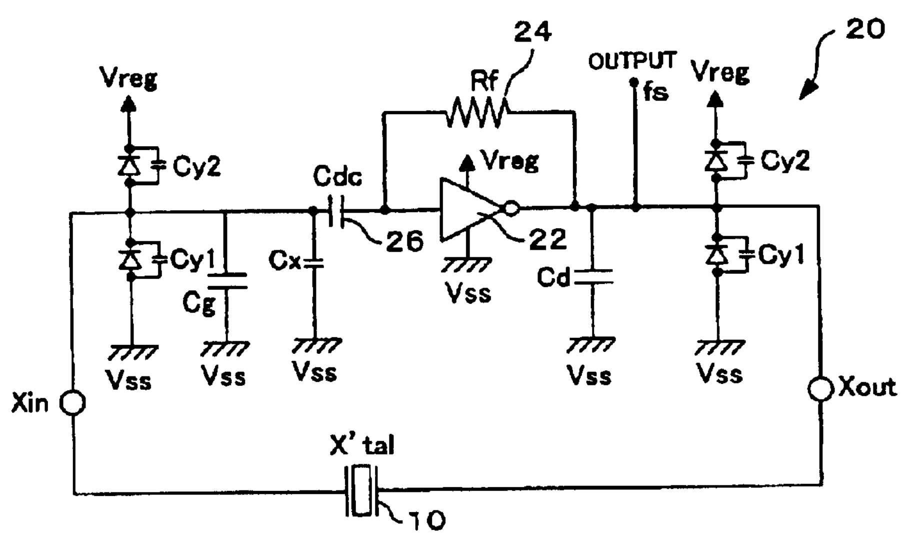
FIG. 2 is an illustrative view of a conventional oscillation circuit that does use a DC-cutting capacitor.

The description now turns to details of preferred embodiments of the oscillation circuit of the present invention. Note that components corresponding to those in the previously described FIGS. 1 and 2 are denoted by the same reference numbers and further description thereof is omitted.

First Embodiment

Figure 3:
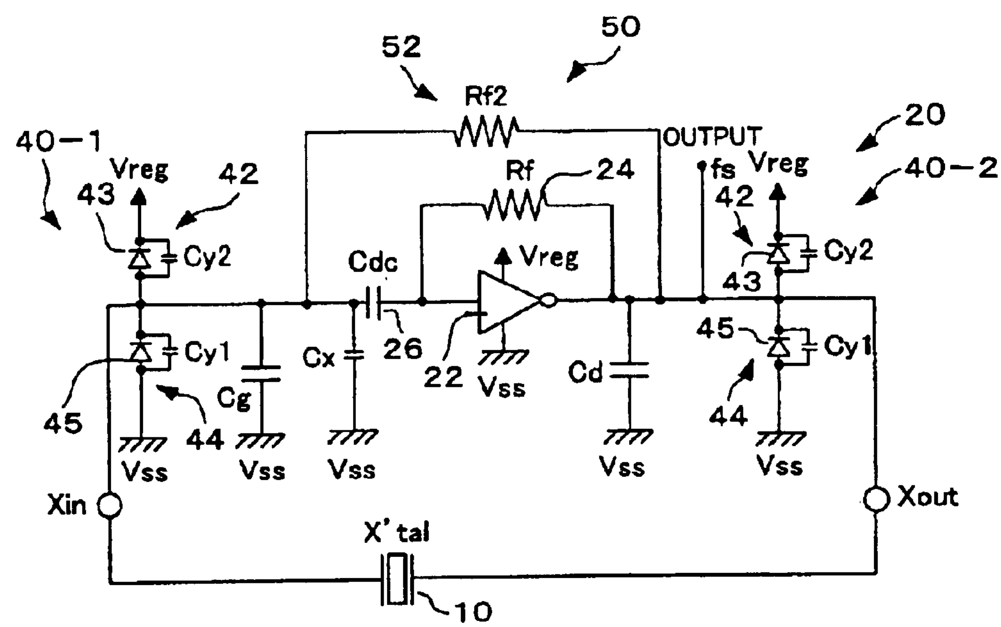
FIG. 3 is an illustrative view of an oscillation circuit in accordance with a first embodiment of the present invention.

An oscillation circuit in accordance with a first embodiment is shown in FIG. 3.

This oscillation circuit comprises the crystal oscillator 10 that acts as an oscillation source, and the main circuit portion 20 that is connected by a signal path to this crystal oscillator 10 and is driven in oscillation.

The main circuit portion 20 is formed as a semiconductor device. More specifically, it is formed integrally on the semiconductor substrate and the two ends of the crystal oscillator 10 are connected to the input-output terminals Xin and Xout of the signal path thereof.

The main circuit portion 20 comprises the inverter 22 that is connected by the input-output terminals Xin and Xout to the crystal oscillator 10, the feedback resistor 24, and the DC-cutting capacitor 26 that acts as an element galvanically, or in a DC manner, separating the signal path provided between the input side of the inverter 22 and the input terminal Xin of the signal path.

Figure 13:
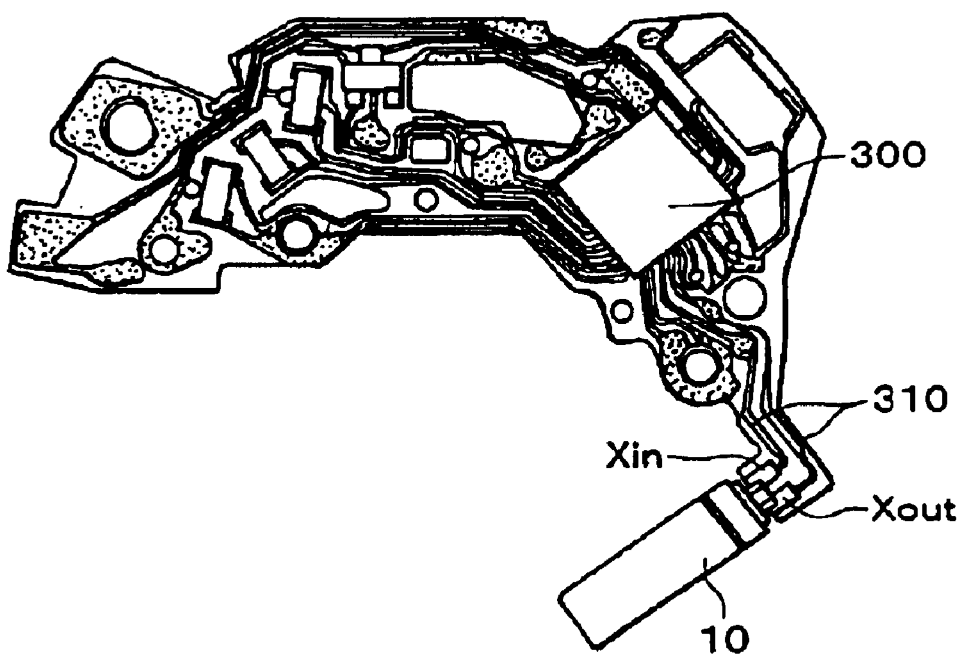
FIG. 13 is an illustrative view of the disposition of a C-MOS IC that forms a crystal oscillator and the main portion of an oscillation circuit.

However, if such an oscillation circuit is used for creating a timepiece circuit or the like, this circuitry apart from the crystal oscillator 10 is basically formed as a C-MOS IC 300 that is a semiconductor device, as shown by way of example in FIG. 13, and the connection between the C-MOS IC 300 that forms the main circuit portion 20 of the oscillation circuit and the crystal oscillator 10 is done by the input-output terminals Xin and Xout and wiring 310. In other words, the crystal oscillator 10 is attached externally to the C-MOS IC 300 by the input-output terminals Xin and Xout. There is therefore a danger that a certain amount of leakage could occur at these input-output terminals Xin and Xout due to a cause such as light or humidity, or a surge voltage could be introduced, destroying the internal circuitry.

For that reason, electrostatic protection circuits 40-1 and 40-2 are provided in the signal lines on the input-output terminals Xin and Xout sides of the main circuit portion 20, preventing any surge voltage that intrudes from the exterior from intruding into the main circuit portion 20.

Each of these electrostatic protection circuits 40-1 and 40-2 is formed to comprise first protection circuits 42 and 42, which is connected between the signal path and a predetermined constant voltage Vreg to selectively bypass any electrostatic voltage of a first polarity that intrudes into the signal path towards the constant voltage Vreg side, and second protection circuits 44 and 44, which is connected between the signal path and a reference potential Vss to selectively bypass any electrostatic voltage of a second polarity that intrudes into the signal path towards the reference potential Vss side.

First and second semiconductor rectifier elements 43 and 45 are configured by using pn-junction diodes. The diode that forms the first semiconductor rectifier element 43 is connected facing toward the constant voltage Vreg side and the diode that forms the second semiconductor rectifier element 45 is connected facing away from the reference potential Vss side.

This ensures that any surge voltage or a negative polarity or positive polarity that intrudes from the exterior is bypassed through one of the electrostatic protection circuits 40-1 and 40-2, preventing it from entering the interior of the main circuit portion 20.

In this case, Cy2 and Cy1 denote the parasitic capacitances of the diodes that function as the first and second semiconductor rectifier elements 43 and 45, respectively. In this figure, Cg and Ds denote the capacitances on the input terminal side and the output terminal side of the crystal oscillator 10, respectively. In addition, Cx denotes the parasitic capacitance of the DC-cutting capacitor 26.

If the DC-cutting capacitor 26 is provided within the circuit, as shown in the oscillation circuit of this embodiment, the potential of the input terminal Xin of the crystal oscillator 10 is close to the open state and the input terminal potential is unstable, as described previously. Any change in the potential of the input terminal Xin of the crystal oscillator 10 changes the parasitic capacitances Cy1, Cy2, and Cx connected to the input terminal Xin, so that the capacitance also changes.

Therefore, if a slight leakage occurs at the input terminal Xin of the crystal oscillator 10 due to an external disturbance such as an increase of humidity or light, changing the potential of the input terminal Xin, the parasitic capacitances will change accordingly. Since the oscillation frequency of the oscillation circuit also changes as a result of such a change in the parasitic capacitances, a problem occurs in that it becomes difficult to obtain stable oscillation.

Since the oscillation circuit of this embodiment is provided with a potential stabilization circuit 50 connected by an element that functions as a resistor between the input terminal Xin side of the crystal oscillator 10 and the circuit portion with a stabilized potential, the above-described problem can be solved.

In this case, the circuit portion with a stabilized potential could be selected as necessary from the constant voltage Vreg side, the reference potential Vss side, the input or output side of the inverter 22, the output terminal side of the crystal oscillator 10, and a circuit portion with a stabilized potential of another electronic circuit that is provided on the semiconductor substrate.

With this embodiment, a resistor 52 is used as the element that functions as a resistor, this resistor 52 is connected between the input terminal Xin side of the crystal oscillator 10 and the output side of the inverter 22 to form the potential stabilization circuit 50.

This ensures that the potential of the input terminal Xin side of the crystal oscillator 10 does not reach an open state, even though the DC-cutting capacitor 26 is provided. It is therefore possible to implement a stable oscillation circuit in which there is no change in the oscillation frequency caused by a small leakage due to light, humidity, or the like and in which there is no halt in the oscillation due to leakage between the input terminal Xin of the crystal oscillator 10 and the power source.

In this case, it is preferable that the resistance of the resistor 52 is set such that the combined resistance together with that of the feedback resistor 24 is within the range of 10 to 100 MΩ, for reasons given below.

It has been confirmed that stable oscillation can be obtained in the conventional oscillation circuits of FIGS. 1 and 2 by setting the resistance of the feedback resistor 24 to be within the range of 10 to 100 MΩ.

With the oscillation circuit in accordance with this embodiment, shown in FIG. 3, the resistor 52 also functions as part of the feedback resistor. For that reason, it is possible to achieve oscillation that is similar to that of an oscillation circuit in which stable oscillation is detected, by setting the combined resistance of the feedback resistor 24 and the resistor 52, in other words, the parallel combined resistance of these two resistors 24 and 52, to within the range of 10 to 100 MΩ.

Second Embodiment

Figure 4:
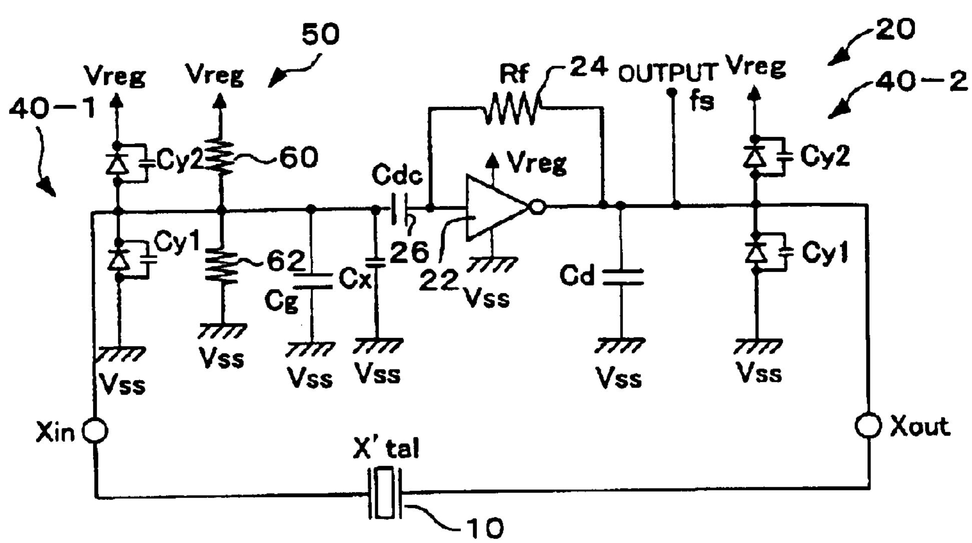
FIG. 4 is an illustrative view of an oscillation circuit in accordance with a second embodiment of the present invention.

A second embodiment of the oscillation circuit in accordance with the present invention is shown in FIG. 4. Note that components that correspond to those of the embodiment shown in FIG. 3 are denoted by the same reference numbers and further description thereof is omitted.

In this embodiment, the potential stabilization circuit 50 uses a configuration that applies a bias voltage to the input terminal Xin side of the signal path through an element that functions as a resistor, to make the input terminal voltage stable.

In this case, bias resistors 60 and 62 are used as the previously described element that functions as a resistor. One bias resistor 60 is connected between the input terminal Xin side and the constant voltage Vreg side and the other bias resistor 62 is connected between the input terminal Xin side and the reference potential Vss side.

Use of the above-described configuration makes it possible to achieve operating effects similar to those of the first embodiment.

Variants of the second embodiment of FIG. 4 are shown in FIGS. 5A to 5D.

The embodiment of FIG. 4 was described as an example in which the bias resistors 60 and 62 are used as the element that functions as a resistor, but in these embodiments a transistor is used as the element that functions as a resistor. In other words, the resistance inherent to a transistor is employed as a bias resistor.

Figures 5A, 5B, 5C, 5D:
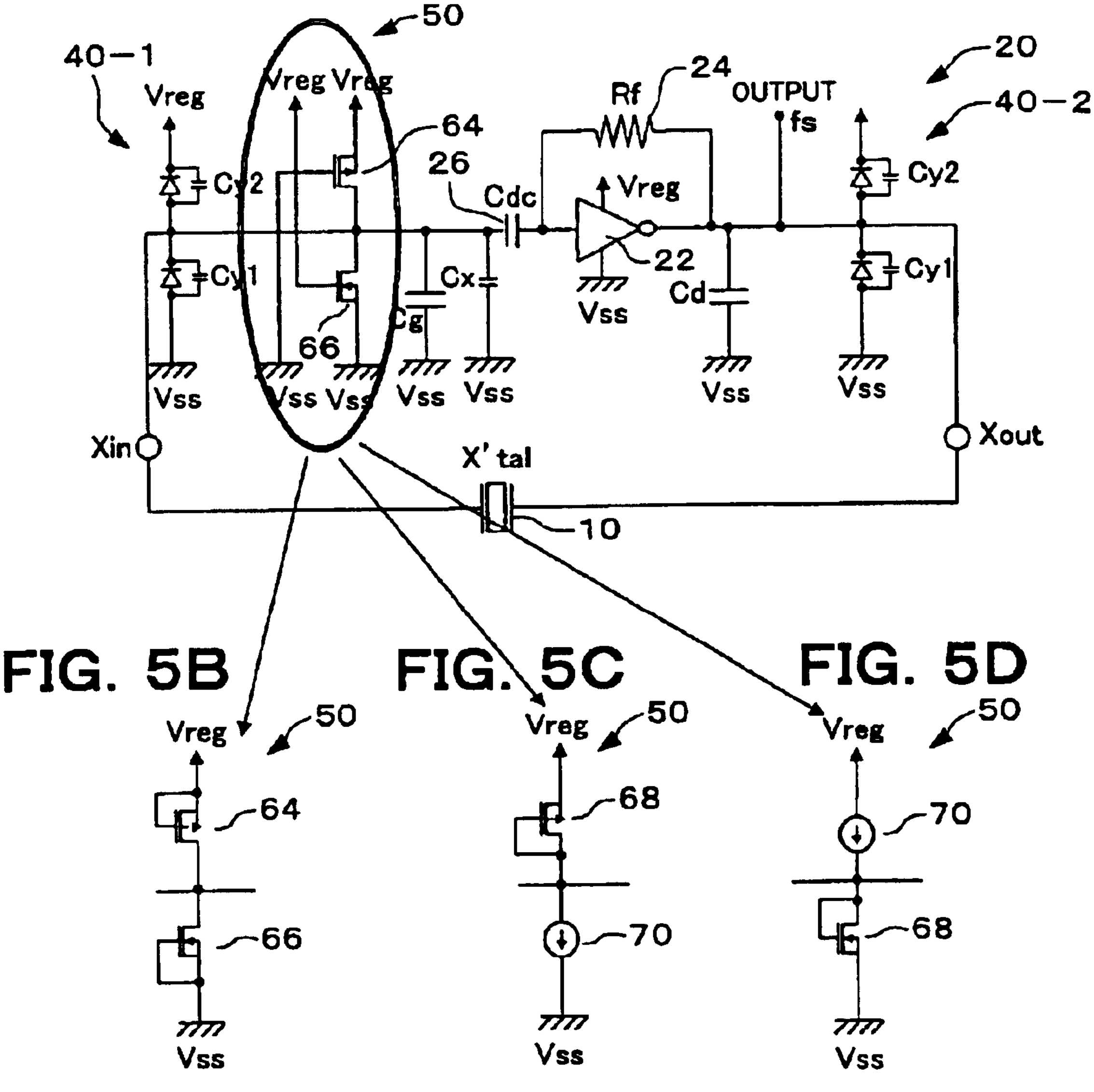
FIGS. 5A to 5D show variants of the oscillation circuit of the second embodiment shown in FIG. 4, with FIG. 5A being an illustrative view of an oscillation circuit using a potential stabilization circuit that employs the on-resistance of transistors, FIG. 5B being an illustrative view of an oscillation circuit using a potential stabilization circuit that employs the off-resistance of transistors, and FIGS. 5C and 5D being illustrative views of oscillation circuits that employ a potential stabilization circuit using the connection for saturation operation and a constant current source of a transistor.

In the embodiment shown in FIG. 5A, for example, a configuration is employed in which the on-resistance of transistors are used to apply a bias voltage. More specifically, transistors 64 and 66 are used instead of the bias resistors 60 and 62, with the configuration being such that a voltage is applied to the gates thereof so that they are always on.

This configuration makes it possible to use the on-resistance of the two transistors 64 and 66 of the potential stabilization circuit 50 of this embodiment to apply a bias voltage to the input terminal Xin, stabilizing the potential thereof.

In FIG. 5B, the off-resistance of the transistors 64 and 66 is used instead of the bias resistors 60 and 62, to apply a bias voltage to the input terminal Xin side. In other words, a configuration is employed in which a potential is applied to the gates of the two transistors 64 and 66 to put them in an off state, to apply a bias voltage to the input terminal Xin in a similar manner to that of the second embodiment.

In FIGS. 5C and 5D, the configuration is such that a transistor 68 connected for saturation operation and a constant current source 70 are used instead of the bias resistors 60 and 62 of FIG. 4, to apply a bias voltage to the input terminal Xin side.

In this manner, it is possible to use a potential stabilization circuit 50 of any of the types shown in FIGS. 5A to 5D, as necessary, to apply a bias voltage to the input terminal Xin and thus stabilize the potential thereof.

Third Embodiment

Figure 6:
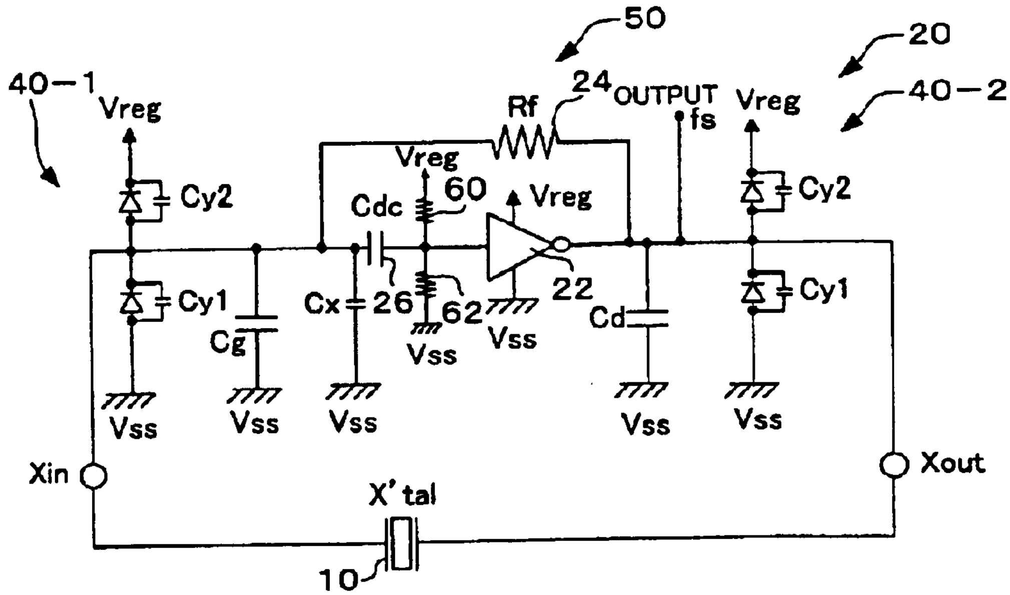
FIG. 6 is an illustrative view of an oscillation circuit in accordance with a third embodiment of the present invention.

A third embodiment of the oscillation circuit of the present invention is shown in FIG. 6. Note that components that correspond to those of the previous embodiments are denoted by the same reference numbers and further description thereof is omitted.

The characteristic of the potential stabilization circuit 50 of this embodiment is that it is configured so that the other end of the feedback resistor 24 that has one end connected to the output side of the inverter 22 is connected to the input terminal Xin of the signal path, instead of the input side of the inverter 22, stabilizing the potential of the input terminal Xin side.

Since the use of this configuration raises the danger of the potential of the input side of the inverter 22 becoming unstable, a configuration is used in which the input side of the inverter 22 is connected to the constant voltage Vreg and the reference potential Vss sides by the bias resistors 60 and 62.

Use of the above-described configuration makes it possible to achieve operating effects similar to those of the oscillation circuits of the previous embodiments.

Figure 7:
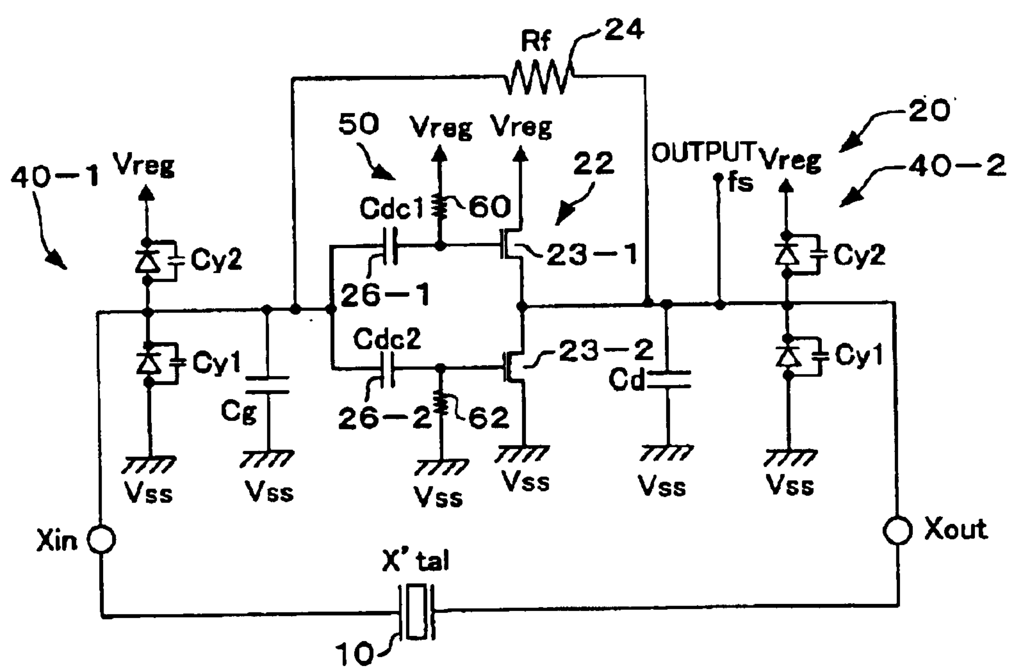
FIG. 7 is an illustrative view of a variant of the oscillation circuit of the third embodiment shown in FIG. 6.

A variant of the embodiment of FIG. 6 is shown in FIG. 7.

In this embodiment, individual DC-cutting capacitors 26-1 and 26-2 are connected to the gates of transistors 23-1 and 23-2 that form the inverter 22.

The gate of the transistor 23-1 is connected to the constant voltage Vreg side by the bias resistor 60 and the gate of the transistor 23-2 is connected to the reference potential Vss side by the bias resistor 62.

Fourth Embodiment

Figure 8:
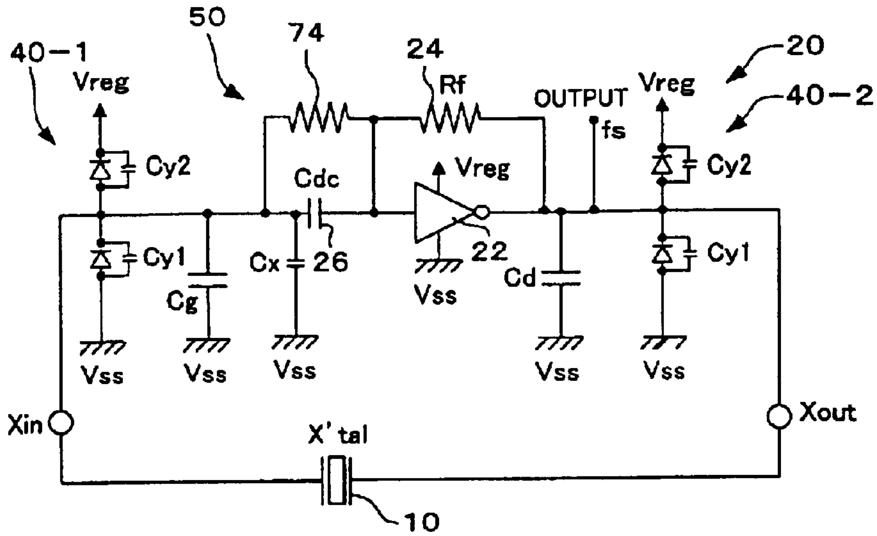
FIG. 8 is an illustrative view of an oscillation circuit in accordance with a fourth embodiment of the present invention.

A fifth embodiment of the oscillation circuit of the present invention is shown in FIG. 8. Note that components that correspond to those of previous embodiments are denoted by the same reference numbers and further description thereof is omitted.

In the oscillation circuit of this embodiment, the potential stabilization circuit 50 is formed by connecting the element that functions as a resistor parallel to the DC-cutting capacitor 26. In this case, a resistor 74 is connected in parallel with the DC-cutting capacitor 26.

Use of the above-described configuration makes it possible to achieve operating effects similar to those of the oscillation circuits of the previous embodiments.

In this case, the resistance of the resistor 74 is preferably set to be greater than that of the feedback resistor 24. Since the feedback resistor 24 is usually set to be within the range of 10 to 100 MΩ, the resistance of the resistor 74 in this case is set to be at least 100 MΩ.

Embodiment that Reduces Parisitic Capacitance

Note that the previous embodiments related to configurations designed to implement an oscillation circuit that operates stably without any change in the oscillation frequency caused by a small leakage due to light, humidity, or the like and without any fear of the oscillation being halted by leakage between the input terminal Xin of the crystal oscillator and the power source, by stabilizing the potential at the input terminal Xin side.

The description now turns to a configuration designed to suppress any change in oscillation frequency caused by a small leakage due to light, humidity, or the like, by removing or reducing the parasitic capacitance applied to the input terminal Xin side of the crystal oscillator 10.

Figure 9:
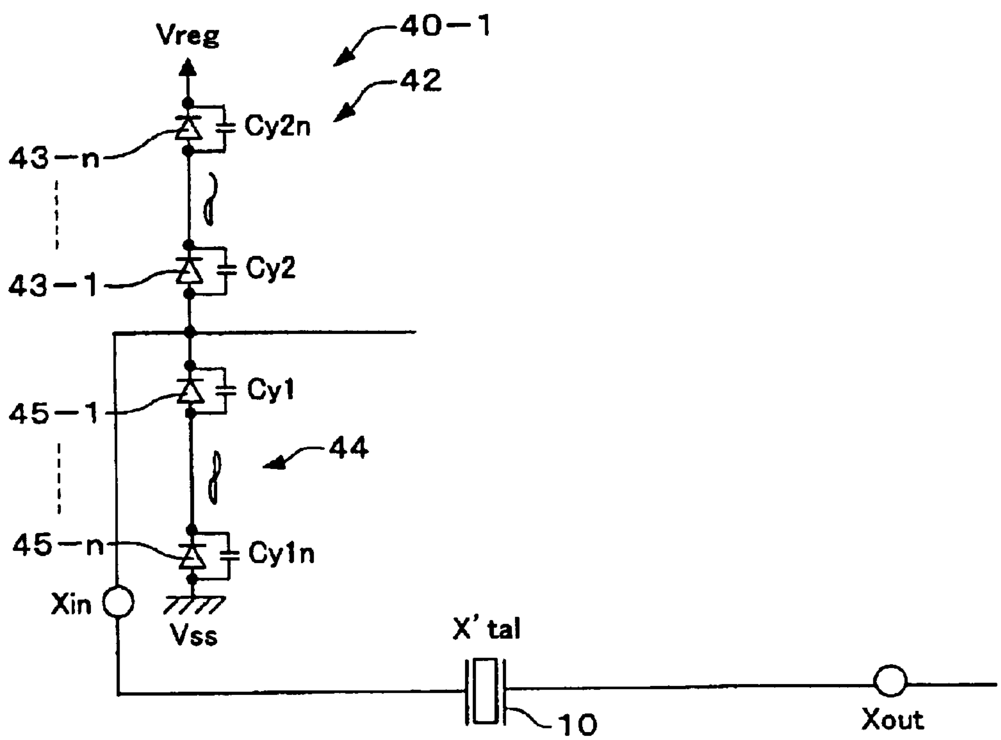
FIG. 9 is an illustrative view of an electrostatic protection circuit used in an oscillation circuit.

An example of this configuration is shown in FIG. 9.

The oscillation circuit of this embodiment illustrates a configuration for reducing the parasitic capacitances of the first and second protection circuits 42 and 44 that form an electrostatic protection circuit 40-1.

The first protection circuit 42 is configured of parasitic capacitances Cy2 to Cy2n of diodes 43-1 to 43-n that are a plurality of diodes 43 connected in series, where the total capacitance of these parasitic capacitances Cy2 to Cy2n is made small. Similarly, the second protection circuit 44 is configured of parasitic capacitances Cy1 to Cy1n of diodes 45-1 to 45-n that are a plurality of diodes 45 connected in series, where the total capacitance of these parasitic capacitances Cy1 to Cy1n is made small.

Use of the above-described configuration makes it possible to reduce the parasitic capacitance applied to the input terminal Xin, making it possible to minimize changes in the oscillation frequency fs.

Figure 10:
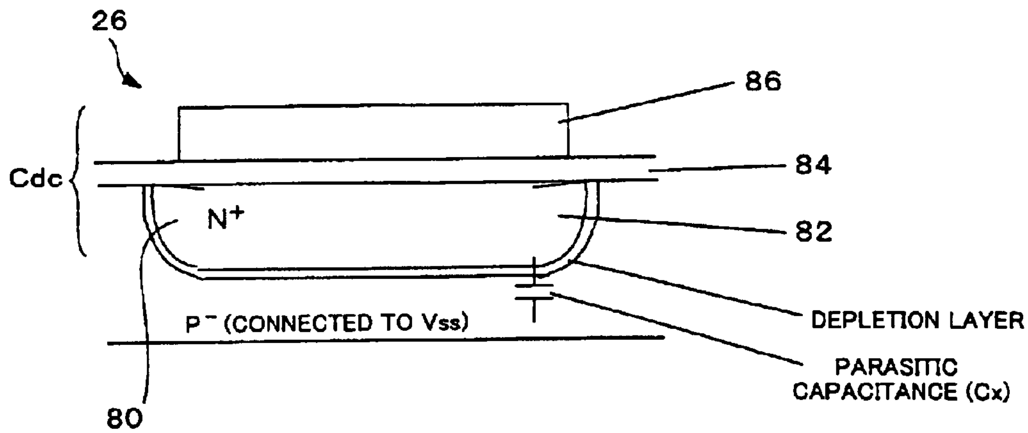
FIG. 10 is an illustrative view of an example of a DC-cutting capacitor used in an oscillation circuit.
Figure 11:
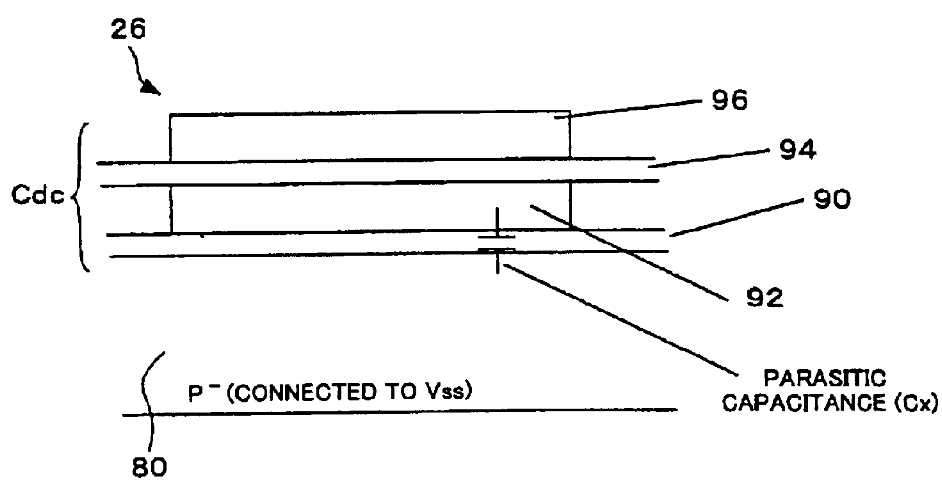
FIG. 11 is an illustrative view of another example of a DC-cutting capacitor used in an oscillation circuit.

Further configurations for minimizing changes in oscillation frequency by reducing or removing the parasitic capacitance Cx that is applied to the input terminal Xin are shown in FIGS. 10 and 11.

In the embodiment shown in FIG. 10, the DC-cutting capacitor 26 is formed of an $SiO_2$ layer 84 that is a dielectric layer and a polysilicon layer 86 that is an electrode layer, overlaid on a diffusion region 82 of a semiconductor substrate 80.

The diffusion region 82 that forms one electrode of the DC-cutting capacitor 26 is connected to the input side of the inverter 22 and the polysilicon layer 86 that is the other layer thereof is connected to the input terminal Xin side of the signal path.

Use of the above-described configuration makes it possible to reduce the parasitic capacitance applied to the input terminal Xin by connecting the parasitic capacitance Cx of the DC-cutting capacitor 26 to the input side of the inverter 22, thus making it possible to stabilize the oscillation frequency.

In other words, in the DC-cutting capacitor 26 configured as shown in FIG. 10, the semiconductor substrate is connected to the reference potential Vss. A parasitic capacitance Cx is therefore created between the diffusion region and the reference potential Vss.

In a conventional oscillation circuit, the diffusion region 82 that is one electrode of the DC-cutting capacitor 26 is connected to the input terminal Xin side of the signal path, so that the parasitic capacitance Cx of the DC-cutting capacitor 26 is applied to the input terminal Xin side, as shown by way of example in FIGS. 3 to 8, etc.

In contrast thereto, the diffusion region 82 that is one electrode of the DC-cutting capacitor 26 of this embodiment is connected to the inverter 22 side, so that the parasitic capacitance Cx thereof is applied to the input side of the inverter 22 instead of the input terminal Xin side, the parasitic capacitance applied to the input terminal Xin is reduced by that amount, thus making it possible to implement an oscillation circuit that operates with a stabilized oscillation frequency.

Another embodiment of the DC-cutting capacitor 26 used in the oscillation circuit is shown in FIG. 11.

The DC-cutting capacitor 26 of this embodiment is formed of an $SiO_2$ layer 90 that is a dielectric layer formed on the semiconductor substrate 80, then a polysilicon layer 92 that is an electrode layer, an $SiO_2$ layer 94 that is a dielectric layer, and an aluminum layer 96 that is another electrode layer, formed on this $SiO_2$ layer 90.

In the DC-cutting capacitor 26 configured in this manner, a parasitic capacitance Cx is created between the polysilicon layer 92 that functions as one of the electrode layers and the semiconductor substrate 80 that is connected to the reference potential Vss, but since that parasitic capacitance Cx is not the parasitic capacitance determined by the amount of the depletion layer as in the parasitic capacitance of FIG. 10, there is no change in the capacitance due to potential changes.

Since the DC-cutting capacitor 26 of this embodiment therefore has no change in the parasitic capacitance even if the potential of the input terminal Xin of the crystal oscillator 10 changes, it is possible to reduce changes in oscillation frequency even further from that point of view.

Note that since the oscillation circuits in accordance with the above embodiments are oscillation circuits wherein stable operation is ensured, without any change in oscillation frequency caused by a small leakage due to light, humidity, or the like and with little danger of oscillation halt due to leakage between the input terminal Xin and the power source, they are suitable for use as oscillation circuits in various electronic apparatuses and timepieces where an accurate oscillation frequency is required even in a small package. In other words, use of the oscillation circuit in accordance with this embodiment in various electronic apparatuses and timepiece circuits makes it possible to implement highly precise, but small, electronic apparatuses and timepieces. For example, it is possible to create an electronic apparatus that has the oscillation circuit in accordance with this embodiment together with a functional portion that is controlled on the basis of an output of the oscillation circuit, and it is also possible to create a timepiece that has the oscillation circuit in accordance with this embodiment and a time display portion that forms a time display based on an output of the oscillation circuit.

Note that the present invention is not limited to the embodiments described herein, and thus various modifications are possible within the scope of the present invention.

For example, the embodiments shown in FIGS. 4 and 5A to 5D were described as having a configuration in which a voltage-dividing circuit that uses an element that functions as a resistor formed the potential stabilization circuit 50, and the voltage-divided output of that voltage-dividing circuit was applied as a bias voltage to the input terminal Xin of the signal path, to stabilize the input terminal voltage, by way of example. However, the present invention is not limited thereto and the configuration could be such that an element that functions as a resistor could be used to connect the input terminal Xin side to either the constant voltage Vreg side or the reference potential Vss side, as shown in FIGS. 12A to 12D, to stabilize the potential of the input terminal Xin.

Figure 12A:
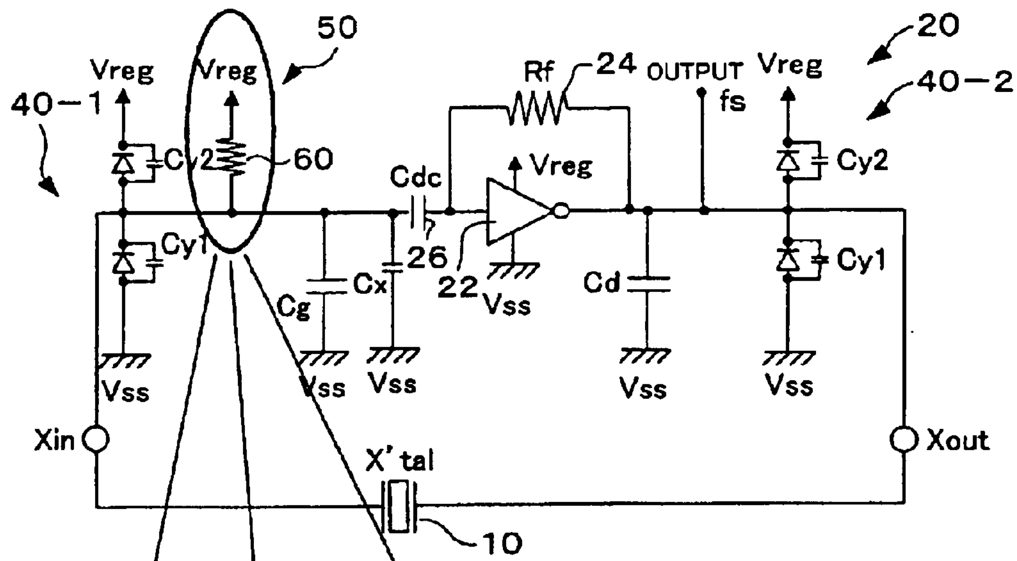
FIGS. 12A to 12D are illustrative views of variants of the embodiment of FIGS. 4, and 5A to 5D.
Figure 12B:
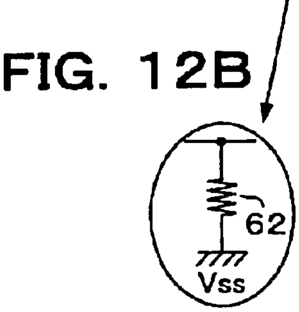

As shown in FIGS. 12A and 12B, a configuration could be employed in which one of the resistors 60 and 62 is used to connect the input terminal Xin side to one of the constant voltage Vreg side and the reference potential Vss side, to stabilize the potential of the input terminal Xin.

Figure 12D:
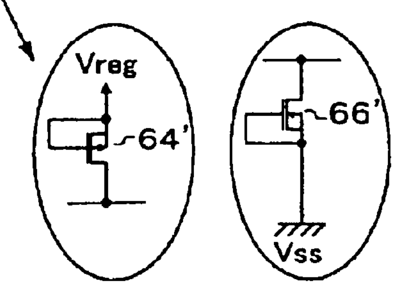
Figure 12C:
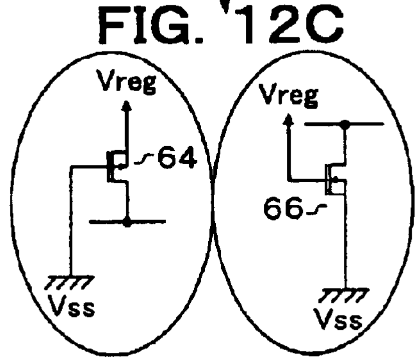

As shown in FIG. 12C, a configuration could be employed in which one of the transistors 64 and 66, in a configuration such that a voltage is applied to the gate thereof to keep it always on, is used to connect the input terminal Xin side to one of the constant voltage Vreg side and the reference potential Vss side, to stabilize the potential of the input terminal Xin.

As shown in FIG. 12D, a configuration could be employed in which one of the transistors 64 and 66, in a configuration such that a voltage is applied to the gate thereof to keep it always off, is used to connect the input terminal Xin side to one of the constant voltage Vreg side and the reference potential Vss side, to stabilize the potential of the input terminal Xin.

What is claimed is:

1. An oscillation circuit having an oscillation source and a main circuit portion connected by a signal path to the oscillation source and driven by the oscillation source, the main circuit portion comprising:

an inverter connected to the oscillation source by the signal path;

a feedback resistor connected between the output side and the input side of the inverter;

an element that galvanically separates the signal path between an input terminal of the signal path and the input side of the inverter; and a potential stabilization circuit that connects the input terminal side of the signal path to a circuit portion with a stabilized potential through an element that functions as a resistor, wherein an electrostatic protection circuit is provided on the input terminal side of the signal path, and wherein the electrostatic protection circuit comprises at least one of:

a first protection circuit connected between the signal path and a predetermined constant voltage side, for causing any electrostatic voltage of a first polarity that intrudes into the signal path to be bypassed selectively to the constant voltage side; and a second protection circuit connected between the signal path and a reference potential side, for causing any electrostatic voltage of a second polarity that intrudes into the signal path to be bypassed selectively to the reference potential side.

2. The oscillation circuit as defined in claim 1, wherein the circuit portion with a stabilized potential is one of a constant voltage side and a reference potential side.

3. The oscillation circuit as defined in claim 1, wherein the potential stabilization circuit connects the input terminal side of the signal path to an output terminal side of the signal path through the element that functions as a resistor.

4. The oscillation circuit as defined in claim 3, wherein the element that functions as a resistor is set to have a resistance together with the feedback resistor within the range of 10 to 100 MΩ.

5. A timepiece comprising the oscillation circuit as defined in claim 1 and a time display portion that displays time based on an output of the oscillation circuit.

6. The oscillation circuit as defined in claim 1, wherein the potential stabilization circuit is configured in such a manner that one end of the feedback resistor, which is connected by the other end to the output side of the inverter, is connected to the input terminal side of the signal path, instead of to the input side of the inverter.

7. The oscillation circuit as defined in claim 6, wherein a bias voltage is applied to the input side of the inverter through the element that functions as a resistor.

8. The oscillation circuit as defined in claim 1, wherein the potential stabilization circuit is formed by connecting the element that functions as a resistor, parallel to the element that galvanically separates the signal path.

9. The oscillation circuit as defined in claim 8, wherein the element that functions as a resistor is set to have a resistance value that is larger than a resistance value of the feedback resistor.

10. The oscillation circuit as defined in claim 1, wherein the main circuit portion is formed as a semiconductor device, and wherein the oscillation source is an oscillator with one end being connected to the input terminal of the signal path and the other end being connected to an output terminal of the signal path.

11. The oscillation circuit as defined in claim 1, wherein the element that functions as a resistor is formed by using polysilicon.

12. An electronic apparatus comprising the oscillation circuit as defined in claim 1 and a functional portion that is controlled on the basis of an output of the oscillation circuit.

13. An oscillation circuit having an oscillation source and a main circuit portion connected by a signal path to the oscillation source and driven by the oscillation source, the main circuit portion comprising:

an inverter connected to the oscillation source by the signal path;

a feedback resistor connected between the output side and the input side of the inverter;

an element that galvanically separates the signal path between an input terminal of the signal path and the input side of the inverter; and a potential stabilization circuit that connects the input terminal side of the signal path to a circuit portion with a stabilized potential through an element that functions as a resistor;

wherein the element that galvanically separates the signal path is a DC-cutting capacitor formed by overlaying a diffusion region on a semiconductor substrate with a dielectric layer and an electrode layer, and wherein the diffusion region is connected to the input side of the inverter; and the electrode layer is connected to the input terminal side of the signal path.

14. An oscillation circuit having an oscillation source and a main circuit portion connected by a signal path to the oscillation source and driven by the oscillation source, the main circuit portion comprising:

an inverter connected to the oscillation source by the signal path;

a feedback resistor connected between the output side and the input side of the inverter;

an element that galvanically separates the signal path between an input terminal of the signal path and the input side of the inverter; and a potential stabilization circuit that connects the input terminal side of the signal path to a circuit portion with a stabilized potential through an element that functions as a resistor, wherein the element that galvanically separates the signal path is a DC-cutting capacitor that is formed by overlaying a dielectric layer that overlays a semiconductor substrate with an electrode layer, a dielectric layer, and another electrode layer.

15. An oscillation circuit having an oscillation source and a main circuit portion connected by a signal path to the oscillation source and driven by the oscillation source, the main circuit portion comprising:

an inverter connected to the oscillation source by the signal path;

a feedback resistor connected between the output side and the input side of the inverter;

an element that galvanically separates the signal path between an input terminal of the signal path and the input side of the inverter; and a potential stabilization circuit that connects the input terminal side of the signal path to a circuit portion with a stabilized potential through an element that functions as a resistor;

wherein the potential stabilization circuit applies a bias voltage to the input terminal side of the signal path, through the element that functions as a resistor.

* * * * *